United States Patent
Reisinger et al.

(10) Patent No.: US 6,548,846 B2
(45) Date of Patent: Apr. 15, 2003

(54) STORAGE CAPACITOR FOR A DRAM

(75) Inventors: Hans Reisinger, Grünwald; Volker Lehmann, München; Reinhard Stengl, Stadtbergen; Hermann Wendt, Grasbrunn; Gerrit Lange, München; Harald Bachhofer, München; Martin Franosch, München; Herbert Schäfer, Höhenkirchen-Siegertsbrunn, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/734,466

(22) Filed: Dec. 11, 2000

(65) Prior Publication Data

US 2002/0126543 A1 Sep. 12, 2002

Related U.S. Application Data

(63) Continuation of application No. PCT/DE99/01454, filed on May 12, 1999.

(30) Foreign Application Priority Data

Jun. 10, 1998 (DE) .......................................... 198 26 025

(51) Int. Cl.⁷ ............................................. H01L 27/108
(52) U.S. Cl. ........................... 257/296; 438/3; 438/240; 438/397
(58) Field of Search ............................ 438/3, 397, 240; 428/701

(56) References Cited

U.S. PATENT DOCUMENTS

| | | | |
|---|---|---|---|
| 4,907,046 A | | 3/1990 | Ohji et al. |
| 5,032,545 A | * | 7/1991 | Doan et al. ..................... 438/3 |
| 5,438,541 A | | 8/1995 | Ando |
| 5,629,228 A | * | 5/1997 | Madan ........................ 438/397 |
| 5,641,702 A | | 6/1997 | Imai et al. |
| 5,739,049 A | * | 4/1998 | Park et al. ..................... 438/3 |
| 5,972,722 A | * | 10/1999 | Visokay ......................... 438/3 |
| 6,010,931 A | * | 1/2000 | Sun et al. ................... 438/240 |
| 6,080,499 A | * | 6/2000 | Eastep ........................ 428/701 |

FOREIGN PATENT DOCUMENTS

EP 0 821 415 A2 1/1998

OTHER PUBLICATIONS

Patent Abstracts of Japan No. 04–051564 (Hisashi), dated Feb. 20, 1992.

* cited by examiner

Primary Examiner—David Nelms
Assistant Examiner—Mai-Huong Tran
(74) Attorney, Agent, or Firm—Laurence A. Greenberg; Werner H. Stemer; Ralph E. Locher

(57) ABSTRACT

A storage capacitor for a DRAM has a dielectric composed of silicon nitride and has at least two electrodes disposed opposite one another across the dielectric. A material having a high tunneling barrier between the Fermi level of the material and the conduction band of the dielectric is used for the electrodes. Suitable materials for the electrodes are metals such as platinum, tungsten and iridium or silicides.

6 Claims, 3 Drawing Sheets

STORAGE CAPACITOR FOR A DRAM

CROSS-REFERENCE TO RELATED APPLICATION

This application is a continuation of copending International Application No. PCT/DE99/01454, filed May 12, 1999, which designated the United States and which was not published in the English language.

BACKGROUND OF THE INVENTION

Field of the Invention

The invention relates to a storage capacitor for a DRAM (dynamic random access memory) having a dielectric composed of silicon nitride and having at least two electrodes disposed opposite one another across the dielectric.

U.S. Pat. No. 5,629,228 discloses a method for fabricating a DRAM storage capacitor having a dielectric which contains silicon nitride. Also provided are two electrodes which are located opposite one another and may be formed for example from a metal such as tungsten.

Published European Patent Application EP 0 821 415 A2 relates to a capacitor and a corresponding fabrication method. The capacitor is formed from a ferroelectric dielectric which is for example in contact with an electrode made of iridium.

A stored charge Q in each storage capacitor of a DRAM should have at least a value of 25 fC. The operating voltage U of the storage capacitor, which is for example ±1 V in the case of a Gbit DRAM, then defines the minimum storage capacitance C of the capacitor using the relationship Q=C×U.

Moreover, the leakage current $I_L$ through the dielectric of the storage capacitor must only have a magnitude such that the storage capacitor loses no more than 10% of its charge Q during its retention time $t_R$, which is about 1 second in the case of a Gbit DRAM. For the present example of a Gbit DRAM, therefore, the following holds true:

$$I_L < C/(10 \cdot t_R) \quad (1)$$

A dielectric suitable for a storage capacitor of a DRAM and having a dielectric constant $\in$ must therefore satisfy the following two conditions:
(a) Given a desired charge density Q/A on capacitor electrodes having the area A, which corresponds to an electric field E, for which $E \cdot \in \sim Q/A$, the leakage current $I_L$ must not exceed the aforementioned value; the value for $E \cdot \in$ should be as high as possible.
(b) In the event of a decrease in the operating voltage, the above condition (a) leads to scaling with a constant electric field strength. In this case, scaling is understood to mean that with ever larger memories and decreasing operating voltage, the layer thickness of the dielectric of the storage capacitors also decreases, so that ultimately the same field strength prevails in the dielectric. Thus, by way of example, a 64 M memory has a dielectric layer thickness of 100 Å given an operating voltage of 3.3 V, a 264 M memory has a dielectric layer thickness of 60 Å and an operating voltage of 1.25 V, whereas, finally, a 1 G memory has a dielectric layer thickness of 40 Å and an operating voltage of 0.9 V. The scalability ends, however, upon reaching a specific minimum thickness, which must be smaller than the thickness prescribed by the desired charge density Q/A.

In FIG. 3, charge densities $Q_s = Q/A$ are plotted as a function of the thickness of the dielectric in Å, the thickness being divided by $\in$, a curve 1 being calculated for silicon dioxide and a curve 2 being calculated for silicon nitride, and points ○ signifying measurement results for silicon nitride, points □ signifying measurement results for $Ta_2O_5$ and point ● signifying a measurement result for barium strontium titanate (BST). Data accompanying the respective points specify the dielectric layer thickness, that is to say 55 nm for example, the applied voltage, that is to say 2.8 V for example, and the corresponding memory generation, that is to say 1 G for example. FIG. 3 reveals that the calculated values and measured values for silicon nitride correspond to a first approximation.

As long as the curves 1, 2 run horizontally, scalability is present given a constant field strength. This scalability ends, however, at a thickness of approximately 30 Å, and thus it seems impossible that silicon nitride can, with smaller layer thicknesses, be used successfully as a dielectric in storage capacitors.

The end of the scalability is caused by the increase in current due to direct tunneling through the dielectric. This tunneling causes the drastic fall in curves 1, 2 from their horizontal profile to their vertical profile.

It is readily apparent from FIG. 3 that tantalum oxide $Ta_2O_5$ and silicon nitride $Si_3N_4$ are about equivalent with regard to a maximum charge density $Q_s$, while tantalum oxide exhibits somewhat better scalability compared with silicon nitride. BST is significantly better with regard to the maximum charge density $Q_s$ and, moreover, can be scaled almost as desired.

For successful use in DRAMs as a storage capacitor dielectric, it is also necessary that the dielectric has a sufficiently low defect density. It can be shown that such a low defect density can be achieved with silicon nitride, but not yet with tantalum oxide and BST. It should also be taken into consideration that BST has hitherto been used primarily in ceramic capacitors and there is little experience with this material being used for large scale integrated circuits.

For all these reasons, and in particular due to the low defect density and the good integrability in existing DRAM processes, silicon nitride is regarded as the dielectric of first choice even for future DRAM generations.

For the reasons presented above, stacked DRAM capacitors currently have a dielectric made of silicon nitride and usually have electrodes produced from $n^+$-conducting polycrystalline silicon.

SUMMARY OF THE INVENTION

It is accordingly an object of the invention to provide a capacitor for a DRAM which overcomes the above-mentioned disadvantages of the heretofore-known capacitors of this general type and which has an improved scalability in the case of a dielectric made of silicon nitride.

With the foregoing and other objects in view there is provided, in accordance with the invention, a storage capacitor for a dynamic random access memory, including:
 a first electrode composed of iridium or iridium silicide;
 at least one second electrode; and
 a dielectric composed of silicon nitride and provided between the first electrode-and the at least one second electrode.

The object of the invention is achieved with electrodes which are composed of metals such as tungsten or iridium or silicides of these metals. These materials have a high tunneling barrier between the Fermi level of the material and the conduction band of the dielectric. With such electrodes it is possible to reduce the scalability and hence the dielectric layer thickness further to about 25 Å. In the case of a material of a semiconductor, the Fermi level thereof lies in the vicinity of the edge of its valence band.

According to another feature of the invention, the dielectric has a layer thickness of about 25 Å.

The storage capacitor for DRAMs according to the invention is based on the following consideration:

Existing stacked DRAM capacitors have a dielectric made of silicon nitride and electrodes made of $n^+$-conducting polycrystalline silicon, as has already been explained. The leakage current and the scalability are determined by tunneling or direct tunneling of electrons into or through the dielectric made of silicon nitride. This tunneling in turn depends on the tunneling barrier for electrons between silicon nitride and $n^+$-conducting polycrystalline silicon.

FIG. 2 shows the profile of the conduction band L and the valence band V in $n^+$-conducting polycrystalline silicon ($n^+$—Si) and in the dielectric made of silicon nitride ($Si_3N_4$). As can be seen from FIG. 2, there is an energy difference of about 2 eV between the Fermi level F and the bottom edge of the conduction band of the silicon nitride.

Increasing this barrier of 2 eV then reduces both the tunneling current and the scaling limit. However, it is possible to increase the tunneling barrier in a relatively simple manner by using electrodes having a higher work function or activation energy than $n^+$-conducting polycrystalline silicon, that is to say, for example, electrodes made of tungsten, iridium, or made of silicides. Other features which are considered as characteristic for the invention are set forth in the appended claims.

Although the invention is illustrated and described herein as embodied in a storage capacitor for a DRAM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
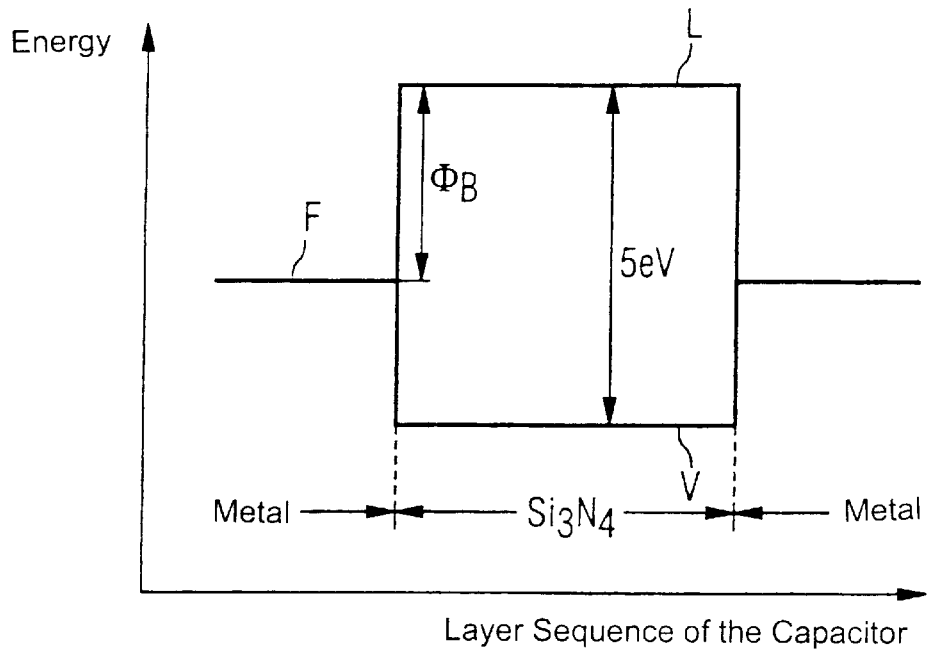
FIG. 1 is a graph illustrating the conduction band and the valence band for a storage capacitor according to the invention.
Figure 2:
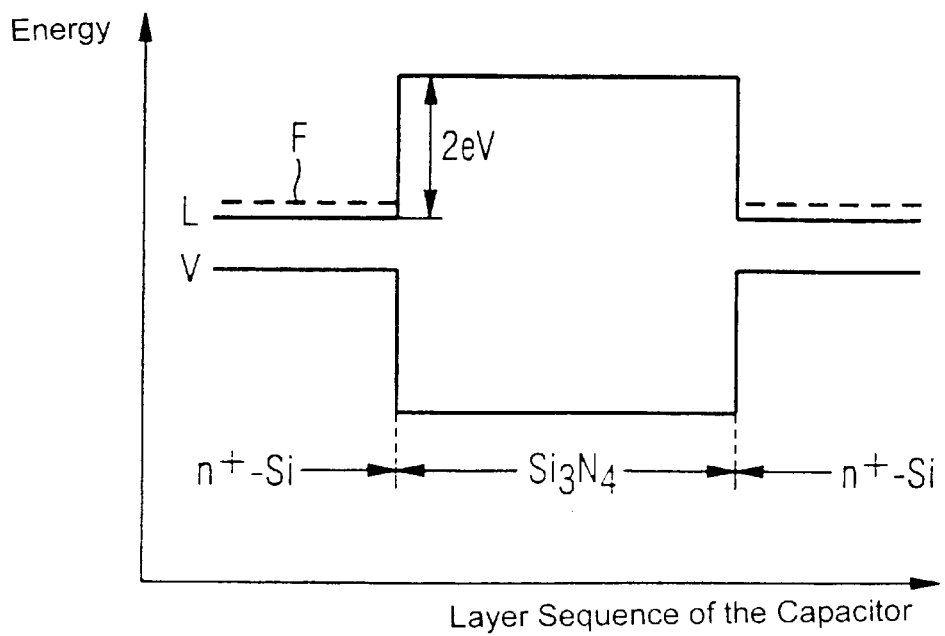
FIG. 2 is a graph illustrating the conduction band and the valence band for a conventional storage capacitor.
Figure 3:
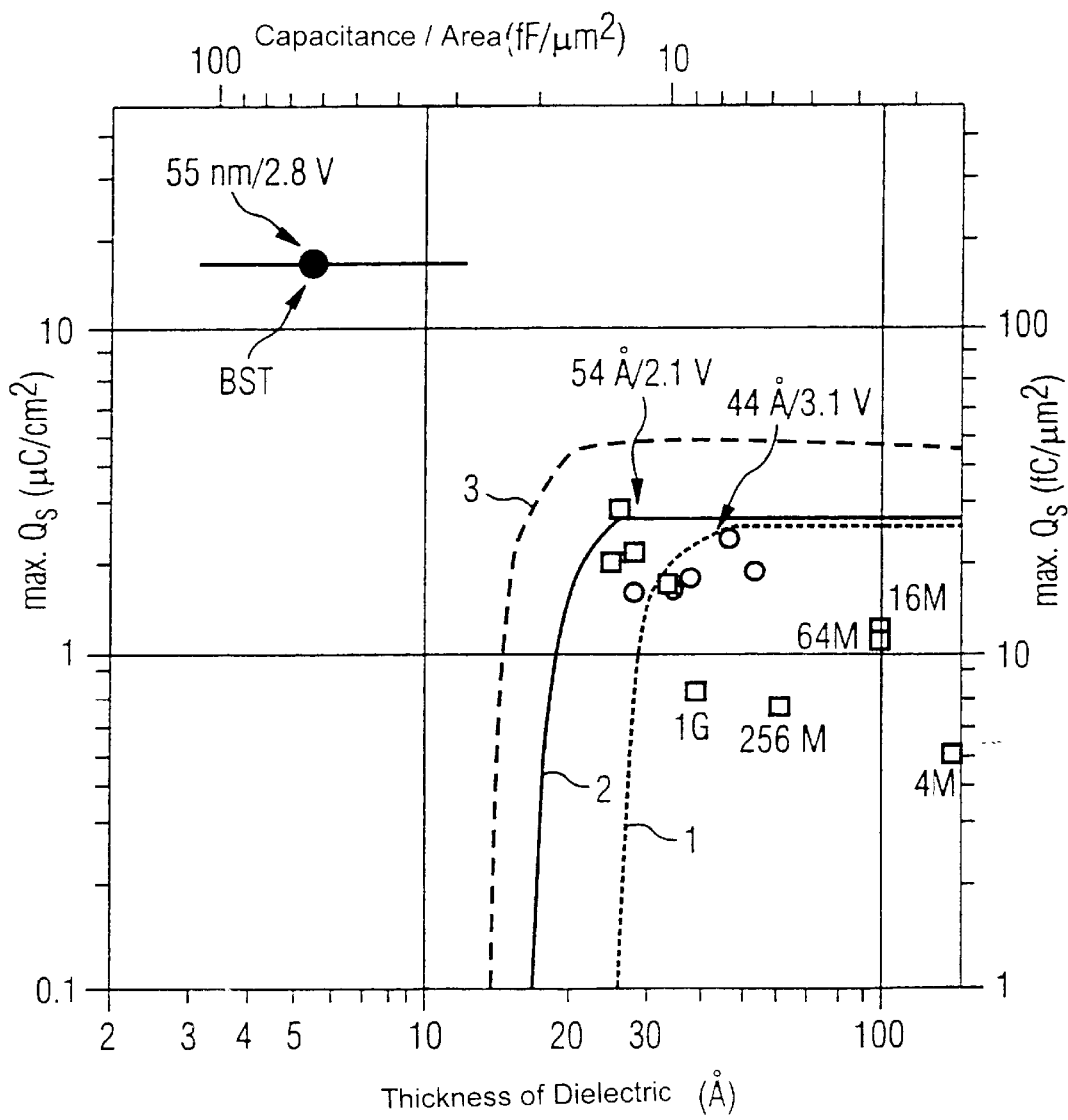
FIG. 3 is a graph illustrating capacitor properties for elucidating advantages that can be obtained with the invention.

Referring now to the figures of the drawings in detail and first, particularly, to FIG. 1 thereof, there is schematically shown the profile of the conduction band and of the valence band in the storage capacitor according to the invention having a dielectric composed of silicon nitride and electrodes made of metal or tungsten silicide. With this material, the Fermi level F lies in the vicinity of the valence band V, resulting in a higher tunneling barrier $\Phi_B$ of about 2.4 eV in the case of tungsten, about 2.6 eV in the case of tungsten silicide and about 3.2 eV in the case of iridium compared with only 2 eV in $n^+$-conducting polycrystalline silicon. This higher tunneling barrier $\Phi_B$ for electrons decreases the tunneling current, which in turn allows the scaling limit to rise: the storage capacitor according to the invention allows to reduce the layer thickness to about 25 Å, which is indicated by a curve 3 in FIG. 3. The maximum charge density $Q_s$ is likewise higher, approximately by a factor of 2, in the case of the storage capacitor according to the invention than in the case of the conventional storage capacitor having electrodes made of $n^+$-conducting polycrystalline silicon, which can likewise be seen when comparing curves 2 and 3 in FIG. 3.

Thus, using relatively simple measures, namely the use of an electrode material having a high work function, the invention makes it possible to achieve a considerable improvement in the scalability and charge density.

Figure 4:
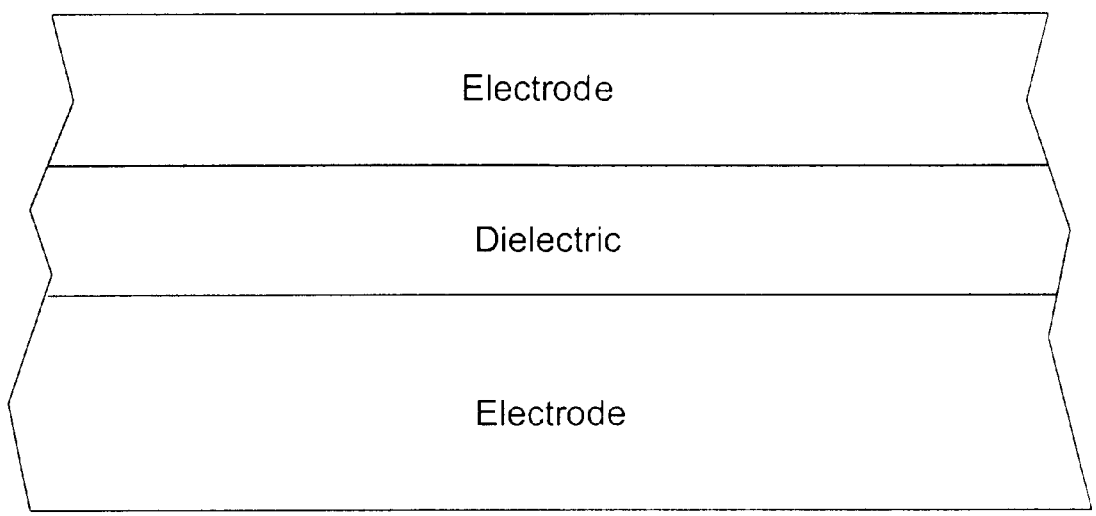
FIG. 4 is a partial, diagrammatic sectional view of a storage capacitor according to the invention.

FIG. 4 is a partial, diagrammatic sectional view of a storage capacitor according to the invention. A dielectric layer formed of silicon nitride is disposed between two electrodes which are provided opposite from one another. The electrodes are formed of metal such as tungsten, iridium or metal silicides.

We claim:

1. A storage capacitor for a dynamic random access memory, comprising:

a first electrode composed of a material selected from the group consisting of iridium and iridium silicide;

at least one second electrode; and a dielectric composed of silicon nitride and provided between said first electrode and said at least one second electrode.

2. The storage capacitor according to claim 1, wherein said dielectric has a layer thickness of substantially 25 Å.

3. The storage capacitor according to claim 1, wherein said dielectric has a layer thickness of at most 25 Å.

4. A storage capacitor for a dynamic random access memory, comprising:

a first electrode composed of tungsten or tungsten silicide;

at least one second electrode; and a dielectric composed of silicon nitride and provided between said first electrode and said at least one second electrode.

5. The storage capacitor according to claim 4, wherein said dielectric has a layer thickness of substantially 25 Å.

6. The storage capacitor according to claim 4, wherein said dielectric has a layer thickness of at most 25 Å.

* * * * *